US009989848B2

(12) United States Patent
Hirayama et al.

(10) Patent No.: US 9,989,848 B2
(45) Date of Patent: Jun. 5, 2018

(54) PHOTOSENSITIVE RESIN COMPOSITION FOR OPTICAL WAVEGUIDE, PHOTOCURABLE FILM FOR FORMATION OF OPTICAL WAVEGUIDE CORE LAYER, OPTICAL WAVEGUIDE PRODUCED BY USING THE RESIN COMPOSITION OR THE PHOTOCURABLE FILM, AND HYBRID FLEXIBLE PRINTED WIRING BOARD FOR OPTICAL/ELECTRICAL TRANSMISSION

(71) Applicant: NITTO DENKO CORPORATION, Ibaraki-shi, Osaka (JP)

(72) Inventors: Tomoyuki Hirayama, Ibaraki (JP); Naoya Sugimoto, Ibaraki (JP)

(73) Assignee: NITTO DENKO CORPORATION, Ibaraki-shi (JP)

(*) Notice: Subject to any disclaimer, the term of this patent is extended or adjusted under 35 U.S.C. 154(b) by 0 days. days.

(21) Appl. No.: 15/305,590

(22) PCT Filed: Apr. 14, 2015

(86) PCT No.: PCT/JP2015/061448
§ 371 (c)(1),
(2) Date: Oct. 20, 2016

(87) PCT Pub. No.: WO2015/166799
PCT Pub. Date: Nov. 5, 2015

(65) Prior Publication Data

US 2017/0038678 A1 Feb. 9, 2017

(30) Foreign Application Priority Data

Apr. 28, 2014 (JP) ................................ 2014-092517

(51) Int. Cl.

| | |
|---|---|
| ***G02B 6/12*** | (2006.01) |
| ***G03F 7/004*** | (2006.01) |
| ***C08G 59/68*** | (2006.01) |
| ***G02B 1/04*** | (2006.01) |
| ***G03F 7/038*** | (2006.01) |
| ***G03F 7/16*** | (2006.01) |
| ***G03F 7/20*** | (2006.01) |
| ***G03F 7/32*** | (2006.01) |
| ***H05K 1/02*** | (2006.01) |
| ***H05K 1/03*** | (2006.01) |
| ***H05K 3/00*** | (2006.01) |
| ***G03F 7/00*** | (2006.01) |

(52) U.S. Cl.
CPC .......... *G03F 7/0045* (2013.01); *C08G 59/68* (2013.01); *G02B 1/046* (2013.01); *G02B 6/12* (2013.01); *G03F 7/0005* (2013.01); *G03F 7/038* (2013.01); *G03F 7/162* (2013.01); *G03F 7/20* (2013.01); *G03F 7/325* (2013.01); *H05K 1/0274* (2013.01); *H05K 1/0326* (2013.01); *H05K 1/0393* (2013.01); *H05K 3/0023* (2013.01); *G02B 2006/12073* (2013.01); *H05K 2201/0108* (2013.01)

(58) Field of Classification Search
None
See application file for complete search history.

(56) References Cited

U.S. PATENT DOCUMENTS

| | | | | |
|---|---|---|---|---|
| 9,696,621 | B2 * | 7/2017 | Hirayama | C08G 59/68 |
| 2012/0027342 | A1 | 2/2012 | Yoshida et al. | |
| 2012/0033913 | A1 | 2/2012 | Kondou et al. | |
| 2012/0155819 | A1 | 6/2012 | Hirayarna et al. | |
| 2013/0287335 | A1 | 10/2013 | Nakashiba et al. | |
| 2016/0085151 | A1 * | 3/2016 | Hirayama | G02B 1/046 385/129 |
| 2016/0326298 | A1 * | 11/2016 | Hirayama | G02B 6/10 |
| 2017/0038678 | A1 * | 2/2017 | Hirayama | H05K 1/0274 |

FOREIGN PATENT DOCUMENTS

| | | | | |
|---|---|---|---|---|
| JP | 2009-15085 | A | 1/2009 | |
| JP | 2010-230944 | A | 10/2010 | |
| JP | 2012-133032 | A | 7/2012 | |
| WO | WO 2010110495 | A1 * | 9/2010 | C08G 59/226 |
| WO | 2010/11629 | A1 | 10/2010 | |

OTHER PUBLICATIONS

Notification of Transmittal of Translation of the International Preliminary Report on Patentability (Form PCT/IB/338) issued in counterpart International Application No. PCT/JP2015/061448 dated Nov. 10, 2016 with Forms PCT/IB/373 and PCT/ISA/237. (6 pages).

International Search Report dated Jun. 23, 2015, issued in counterpart International Application No. PCT/JP2015/061448 (1page).

Office Action dated Sep. 26, 2017, issued in counterpart Japanese Application No. 2014-092517, with English translation. (7 pages).

* cited by examiner

*Primary Examiner* — Tina Wong
(74) *Attorney, Agent, or Firm* — Westerman, Hattori, Daniels & Adrian, LLP

(57) ABSTRACT

The present invention provides an optical waveguide photosensitive resin composition containing a resin component and a photoacid generator, wherein the photoacid generator has a characteristic property (x) such that an absorption limit (O—O transition energy) calculated based on the shape of an ultraviolet spectrum obtained by spectrometrically analyzing a 0.1 wt % propylene carbonate solution of the photoacid generator by means of an ultraviolet/visible spectrophotometer is 3.5 to 4.1 eV. Where an optical waveguide core layer is formed by using the inventive optical waveguide photosensitive resin composition, for example, the optical waveguide core layer has a lower loss, and is excellent in patternability and reflow resistance.

10 Claims, No Drawings

PHOTOSENSITIVE RESIN COMPOSITION FOR OPTICAL WAVEGUIDE, PHOTOCURABLE FILM FOR FORMATION OF OPTICAL WAVEGUIDE CORE LAYER, OPTICAL WAVEGUIDE PRODUCED BY USING THE RESIN COMPOSITION OR THE PHOTOCURABLE FILM, AND HYBRID FLEXIBLE PRINTED WIRING BOARD FOR OPTICAL/ELECTRICAL TRANSMISSION

TECHNICAL FIELD

The present invention relates to an optical waveguide photosensitive resin composition and an optical waveguide core layer formation photocurable film to be used as a material for formation of a core layer or the like of an optical waveguide in an optical/electrical transmission hybrid flexible printed wiring board which is widely used for optical communications, optical information processing and other general optics. The invention further relates to an optical waveguide produced by using the resin composition or the photocurable film, and to a hybrid flexible printed wiring board for optical/electrical transmission.

BACKGROUND ART

A conventional optical waveguide core layer formation material for a hybrid flexible printed wiring board for optical/electrical transmission employs a resin component such as an epoxy resin, and a photoacid generator having an expanded π-conjugated skeleton and imparted with acid generation sensitivity by light-irradiation for photocurable patternability.

RELATED ART DOCUMENT

Patent Document

PTL 1: JP-A-2010-230944

SUMMARY OF INVENTION

Where the photoacid generator having an expanded π-conjugated skeleton is used, however, an absorption peak of the core layer formation material at a short wavelength is liable to broaden to a longer wavelength range. This prevents the loss reduction of a core layer formed from the core layer formation material. For this reason, there is a strong demand for a photosensitive resin composition which has higher loss-reducing capability, higher-resolution patternability and reflow resistance for use as an optical waveguide core layer formation material.

In view of the foregoing, it is an object of the present invention to provide an optical waveguide photosensitive resin composition and an optical waveguide core layer formation photocurable film, which have higher-resolution patternability, higher loss-reducing capability and reflow resistance for use as an optical waveguide formation material, particularly as a core layer formation material, and to provide an optical waveguide produced by using the resin composition or the photocurable film and a hybrid flexible printed wiring board for optical/electrical transmission.

According to a first aspect of the present invention to achieve the above object, there is provided a photosensitive resin composition for an optical waveguide, the photosensitive resin composition containing a resin component and a photoacid generator, wherein the photoacid generator has a characteristic property (x) such that an absorption limit (O—O transition energy) calculated based on the shape of an ultraviolet spectrum obtained by spectrometrically analyzing a 0.1 wt % propylene carbonate solution of the photoacid generator by means of an ultraviolet/visible spectrophotometer is 3.5 to 4.1 eV.

According to a second aspect of the present invention, there is provided a photocurable film for formation of an optical waveguide core layer, the photocurable film being produced by forming the optical waveguide photosensitive resin composition of the first aspect into a film shape.

According to a third aspect of the present invention, there is provided an optical waveguide, which includes a substrate, a cladding layer provided on the substrate, and a core layer provided in a predetermined pattern in the cladding layer for transmission of an optical signal, wherein the core layer is a core layer formed by curing the optical waveguide photosensitive resin composition of the first aspect or the optical waveguide core layer formation photocurable film of the second aspect.

According to a fourth aspect of the present invention, there is provided a hybrid flexible printed wiring board for optical/electrical transmission, the hybrid flexible printed wiring board including the optical waveguide of the third aspect.

The inventors of the present invention conducted studies on the mechanism of causing thermal degradation (coloration) which prevents the loss reduction of a product obtained by curing the core layer formation material. In the studies, the inventors found that the thermal degradation is attributable to a π-conjugation expanding factor occurring due to oxidative degradation of the resin component. In conventional designing of the formulation of the photocurable resin composition, a photoacid generator (e.g., a triphenylsulfonium salt) having a relatively expanded π-conjugated cationic skeleton and imparted with sensitivity at an exposure wavelength of 365 nm is selected as one of the ingredients from the viewpoint of excellent patternability. However, the expanded π-conjugated skeleton is more liable to cause the coloration due to the expansion of the π-conjugated system when a residual anionic moiety left (remaining) after acid generation by light irradiation is degraded by oxidation. Based on this teaching, the inventors further conducted studies and, as a result, conceived an idea of using the photoacid generator having the above characteristic property (x). The inventors found that, where the photoacid generator having the specific characteristic property (x) (i.e., having a contracted π-conjugated cationic skeleton) is used, the resin composition containing the photoacid generator has no sensitivity at an exposure wavelength of 365 nm and, therefore, requires mixed radiation (broad light), but a cured product of the resin composition is less liable to suffer from the coloration and has higher transparency (lower loss) as compared with a conventional case in which the photoacid generator having an expanded π-conjugated cationic skeleton and having a sensitivity at an exposure wavelength of 365 nm is used. Thus, the inventors attained the present invention.

The present invention provides the optical waveguide photosensitive resin composition containing the resin component and the aforementioned specific photoacid generator. Where the core layer of the optical waveguide is formed by using the optical waveguide photosensitive resin composition, for example, the optical waveguide core layer has a lower loss, and is excellent in patternability and reflow resistance.

Where a photoacid generator represented by a general formula (1) to be described later is used as the photoacid generator, the optical waveguide core layer is imparted with higher transparency (lower loss), and is further excellent in reflow resistance.

Where a photoacid generator represented by the general formula (1) or a general formula (2) to be described later wherein X is an antimony hexafluoride anion represented by $SbF_6$ is used as the photoacid generator, the resin composition is less liable to be thermally yellowed and, after light exposure, the cured resin is excellent in yellowing resistance. Where the resin composition is used as a core formation material, the resin composition has a thermal-yellowing suppressing effect. As a result, the resin composition has excellent reflow resistance which is required when the resin composition is used for an optical waveguide or a hybrid flexible printed wiring board for optical/electrical transmission.

DESCRIPTION OF EMBODIMENTS

Next, embodiments of the present invention will be described in detail. However, it should be understood that the present invention be not limited to these embodiments.

<<Photosensitive Resin Composition for Optical Waveguide>>

An inventive photosensitive resin composition for an optical waveguide (hereinafter sometimes referred to simply as "photosensitive resin composition") is obtained by using a resin component and a specific photoacid generator.

The ingredients will hereinafter be described in turn.

<Resin Component>

Examples of the resin component include various epoxy resins for use as a core formation material, e.g., an aliphatic epoxy resin having a polymerizable substituent. The polymerizable substituent-containing aliphatic epoxy resin is preferably solid at room temperature. In the present invention, the term "solid" means that the epoxy resin is in a solid state at a temperature of 25° C.

An example of the polymerizable substituent-containing aliphatic epoxy resin is a side-chain polyfunctional aliphatic epoxy resin. The side-chain polyfunctional aliphatic epoxy resin is an aliphatic resin having two or more functional groups at its side chains, and examples thereof include polyfunctional aliphatic epoxy resins such as 1,2-epoxy-4-(2-oxiranyl)cyclohexane adducts of 2,2-bis(hydroxymethyl)-1-butanol, which may be used alone or in combination. A specific example is EHPE3150 (available from Daicel Corporation). The side-chain polyfunctional aliphatic epoxy resin is preferably solid. As described above, the term "solid" means that the epoxy resin is in a solid state at room temperature (25° C.).

In the epoxy resin such as the side-chain polyfunctional aliphatic epoxy resin, the polymerizable substituent is present, which is preferably a cationic polymerizable substituent. Examples of the cationic polymerizable substituent include an epoxy group and an epoxy group having an alicyclic skeleton.

Another example of the polymerizable substituent-containing epoxy resin is a bifunctional long-chain aliphatic epoxy resin. An example of the bifunctional long-chain aliphatic epoxy resin is a long-chain aliphatic epoxy resin having epoxy groups as polymerizable functional groups at its opposite terminals. By thus using the long-chain aliphatic epoxy resin, the crosslinking density can be reduced in cationic polymerization, thereby imparting the resulting cured product with flexibility. Examples of the bifunctional long-chain aliphatic epoxy resin include hydrogenated bisphenol-A epoxy resins and hydrogenated bisphenol-F epoxy resins, which may be used alone or in combination. Specific examples of the bifunctional long-chain aliphatic epoxy resin include YX-8040 (available from Mitsubishi Chemical Corporation) and ST-4000D (available from Nippon Steel Corporation). In the present invention, the term "aliphatic epoxy resin" is intended to include alicyclic epoxy resins. The bifunctional long-chain aliphatic epoxy resin is preferably solid. As described above, the term "solid" means that the epoxy resin is in a solid state at room temperature (25° C.).

Where the side-chain polyfunctional aliphatic epoxy resin (A) and the bifunctional long-chain aliphatic epoxy resin (B) are used in combination, for example, the mixing weight ratio (A):(B) is preferably (A):(B)=4:1 to 1:1, particularly preferably (A):(B)=3:1 to 1:1. If the weight of the side-chain polyfunctional aliphatic epoxy resin (A) is excessively small with the mixing weight ratio falling outside the aforementioned range, for example, the photo/thermal curing patternability tends to be poorer.

<Specific Photoacid Generator>

The specific photoacid generator is used for imparting the photosensitive resin composition with photocurability, e.g., UV-curability. The photoacid generator to be used in the present invention has a characteristic property (x) such that an absorption limit (O—O transition energy) calculated based on the shape of an ultraviolet spectrum obtained by spectrometrically analyzing a 0.1 wt % propylene carbonate solution of the photoacid generator by means of an ultraviolet/visible spectrophotometer is 3.5 to 4.1 eV.

Since the photoacid generator having the characteristic property (x), i.e., having a contracted π-conjugated cationic skeleton, is used, the resin composition has no sensitivity at an exposure wavelength of 365 nm as described above, and the cured product of the resin composition is less liable to be colored and is imparted with higher transparency as compared with the conventional case in which the photoacid generator having an expanded π-conjugated cationic skeleton is used.

The absorption limit (O—O transition energy) is an absorption limit determined based on an absorption spectrum obtained by analyzing a 0.1 wt % propylene carbonate solution of the photoacid generator. More specifically, a curve indicating the relationship between the absorbance (plotted as ordinate) and the wavelength a (nm) (plotted as abscissa) is drawn, and an absorption limit wavelength (nm) is determined based on a tangential line of a peak at % max (nm) of the curve and converted into an energy value (eV).

In the present invention, the photoacid generator has the aforementioned characteristic property (x), making it possible to achieve the higher-resolution patternability and the loss reduction. If the photoacid generator in the form of the 0.1 wt % propylene carbonate solution has an O—O transition energy lower than the aforementioned range outside the range, the yellowing due to the oxidative degradation during the curing is remarkable. The yellowing (coloration) reduces the transparency (to prevent the loss reduction). If the O—O transition energy is higher than the aforementioned range outside the range, the absorption of light emitted from a high pressure mercury lamp or the like, for example, is significantly reduced. Therefore, the patterning is difficult with a lower photo-cleavage activity. That is, the patternability is poorer.

Examples of the specific photoacid generator include a photoacid generator having a cationic skeletal structure represented by the following general formula (1) and a photoacid generator having a cationic skeletal structure represented by the following general formula (2), which may be used alone or in combination:

$$\underset{R_1}{\diagup}\overset{\overset{R_2}{|}}{S^+}\underset{R_3}{\diagdown} \quad X^- \tag{1}$$

wherein at least two of $R_1$ to $R_3$ are aryl groups, and X is an anion containing antimony, phosphorus or boron;

$$R_4 - I^+ - R_5 \quad X^- \tag{2}$$

wherein $R_4$ and $R_5$, which may be the same or different, are each an aryl group, an alkyl group or a cycloalkyl group, and X is an anion containing antimony, phosphorus or boron.

The photoacid generator may be an arylsulfonium compound, i.e., a compound containing an arylsulfonium as a cation, represented by the general formula (1) wherein at least two of $R_1$ to $R_3$ are aryl groups. All of $R_1$ to $R_3$ of the arylsulfonium compound may be aryl groups, or two of $R_1$ to $R_3$ of the arylsulfonium compound may be aryl groups and the other one may be an alkyl group or a cycloalkyl group. Examples of the arylsulfonium compound include triarylsulfonium compounds, diarylalkylsulfonium compounds and diarylcycloalkylsulfonium compounds.

Preferred examples of the aryl groups of the arylsulfonium compound include a phenyl group, a naphthyl group, and the phenyl group is particularly preferred. The aryl groups may be the same or different. The alkyl group or the cycloalkyl group optionally contained in the arylsulfonium compound is preferably a straight or branched C1 to C15 alkyl group or a C3 to C15 cycloalkyl group. Examples of the alkyl group and the cycloalkyl group include a methyl group, an ethyl group, a propyl group, a n-butyl group, a sec-butyl group, a t-butyl group, a cyclopropyl group, a cyclobutyl group and a cyclohexyl group.

In the above formula (1), the aryl group, the alkyl group and the cycloalkyl group as $R_1$ to $R_3$ may each have a substituent such as an alkyl group (e.g., C1 to C15), a cycloalkyl group (e.g., C3 to C15), an aryl group (e.g., C6 to C14), an alkoxy group (e.g., C1 to C15), a halogen atom or a hydroxyl group. Preferred examples of the substituent include a straight or branched C1 to C12 alkyl group, a C3 to C12 cycloalkyl group and a straight, branched or cyclic C1 to C12 alkoxy group. Further preferred examples of the substituent include a C1 to C4 alkyl group and a C1 to C4 alkoxy group. One or all of the three $R_1$ to $R_3$ may be substituted with the substituent.

In the above general formula (2), $R_4$ and $R_5$ may be independently an aryl group, an alkyl group or cycloalkyl group. Preferred examples of the aryl group as $R_4$ and $R_5$ include a phenyl group and a naphthyl group, and the phenyl group is particularly preferred. The aryl group as $R_4$ and $R_5$ may have a substituent. Preferred examples of the substituent of the aryl group as $R_4$ and $R_5$ include an alkyl group (e.g., C1 to C15), a cycloalkyl group (e.g., C3 to C15), an aryl group (e.g., C6 to C15), an alkoxy group (e.g., C1 to C15), a halogen atom and a hydroxyl group.

For the photoacid generator having the cationic skeletal structure represented by the above general formula (1) and the photoacid generator having the cationic skeletal structure represented by the above general formula (2), X in the formulae (1) and (2) is a counter anion for the cationic skeletal moiety, and is properly selected from antimony-, phosphorus- and boron-containing anions. Particularly, an antimony-containing anion is preferably employed as the counter anion for impartment with higher transparency (lower loss) and for improvement of the reflow resistance. A photoacid generator containing an antimony hexafluoride anion represented by $SbF_6$ as X in the formula (1) or (2) is preferably used.

Examples of the specific photoacid generator having the aforementioned characteristic property (x) include a photoacid generator represented by the formula (1) wherein $R_1$ is a 4-(phenylthio)phenyl group, a 4-(methylthio)phenyl group, a 4-methoxyphenyl group, a 4-methylphenyl group or a phenyl group, $R_2$ and $R_3$ (which may be the same or different) are each a 4-methylphenyl group, a phenyl group, a C1 to C15 alkyl group or a hydrogen atom and X is $SbF_6$, and a photoacid generator represented by the formula (2) wherein $R_4$ and $R_5$ are each a 4-alkylphenyl group (wherein the alkyl group is a straight or branched C1 to C15 alkyl chain) or a phenyl group and X is $SbF_6$. Specific examples of the photoacid generator include WPI-116 (available from Wako Pure Chemical Industries, Ltd.), WPAG-1056 (available from Wako Pure Chemical Industries, Ltd.) and CPI-101A (available from Sun-Apro, Ltd.)

The proportion of the specific photoacid generator is preferably set to 0.1 to 3 parts by weight, more preferably 0.5 to 3 parts by weight, particularly preferably 0.5 to 1 part by weight, based on 100 parts by weight of the resin component of the photosensitive resin composition. If the proportion of the photoacid generator is excessively small, it will be difficult to ensure satisfactory photocurability by irradiation with light (irradiation with ultraviolet radiation). If the proportion of the photoacid generator is excessively great, the photosensitive resin composition tends to have higher photosensitivity to result in an abnormal shape in patterning, and to be poorer in required physical properties associated with an initial loss.

As required, the inventive photosensitive resin composition may contain additives in addition to the resin component and the specific photoacid generator. Examples of the additives include adhesiveness imparting agents, such as silane-based and titanium-based coupling agents, olefin oligomers, cycloolefin oligomers and polymers (e.g., norbornene polymers and the like), synthetic rubbers and silicone compounds, for enhancing the adhesiveness, various antioxidants such as a hindered phenol antioxidant and a phosphorus antioxidant, a leveling agent and a defoaming agent. These additives may be properly blended, as long as the effects of the present invention are not impaired. These may be used alone or in combination.

The proportion of the antioxidant to be blended is preferably set to less than 3 parts by weight, more preferably not greater than 2 parts by weight, particularly preferably not greater than 1 part by weight, based on 100 parts by weight of the resin component (e.g., the polymerizable substituent-containing aliphatic resin) of the photosensitive resin composition. If the proportion of the antioxidant is excessively great, the photosensitive resin composition tends to be poorer in physical properties associated with the initial loss.

The inventive photosensitive resin composition can be prepared by mixing the resin component, the specific photoacid generator and, as required, any of the other additives in predetermined proportions with stirring. Where the inventive photosensitive resin composition is prepared in the form of a coating varnish, the resulting mixture may be dissolved in an organic solvent with heating (e.g., at about 60° C. to about 90° C.) and stirring. The amount of the organic solvent to be used may be properly adjusted, but preferably set to, for example, 20 to 80 parts by weight, particularly preferably 30 to 40 parts by weight, based on 100 parts by weight of the resin component of the photosensitive resin composition. If the amount of the organic solvent to be used is excessively small, the prepared coating varnish tends to have a higher viscosity and hence poorer coatability. If the amount of the organic solvent to be used is excessively great, it will be difficult to form a thicker coating film with the use of the coating varnish.

Examples of the organic solvent to be used for the preparation of the coating varnish include ethyl lactate, methyl ethyl ketone, cyclohexanone, 2-butanone, N,N-dimethylacetamide, diglyme, diethylene glycol methyl ethyl ether, propylene glycol methyl acetate, propylene glycol monomethyl ether, tetramethylfurane and dimethoxyethane. These organic solvents may be used alone or in combination in a proper amount, for example, within the aforementioned range so as to impart the varnish with a viscosity suitable for the coating.

<<Optical Waveguide>>

Next, an optical waveguide will be described, which is produced by using the inventive photosensitive resin composition as a core layer formation material.

The optical waveguide according to the present invention includes, for example, a substrate, a cladding layer (under-cladding layer) provided in a predetermined pattern on the substrate, a core layer provided in a predetermined pattern on the cladding layer for transmitting an optical signal, and another cladding layer (over-cladding layer) provided over the core layer. The optical waveguide according to the present invention has a feature such that the core layer is formed from the aforementioned photosensitive resin composition. Cladding layer formation resin compositions having the same formulation or different formulations may be used as an under-cladding layer formation material and an over-cladding layer formation material. In the optical waveguide according to the present invention, the cladding layers are required to have a lower refractive index than the core layer.

In the present invention, the optical waveguide is produced, for example, through the following process steps. A substrate is prepared, and a photosensitive varnish of a photosensitive resin composition as the cladding layer formation material is applied onto the substrate. The applied photosensitive varnish is cured by irradiating a varnish-applied surface with light such as ultraviolet radiation and, as required, heat-treating the photosensitive varnish. Thus, an under-cladding layer (lower cladding layer portion) is formed.

Then, a core layer formation material (photosensitive varnish) prepared by dissolving the inventive photosensitive resin composition in the organic solvent is applied onto the under-cladding layer to form an uncured core formation layer. After the application of the core layer formation material (photosensitive varnish), the organic solvent is dried off with heating. Thus, an uncured photocurable film for formation of the optical waveguide core layer is formed in a film shape. In turn, a photomask having a predetermined pattern (optical waveguide pattern) for light exposure is put on a surface of the uncured core formation layer. Then, the core formation layer is irradiated with light such as ultraviolet radiation via the photomask and, as required, heat-treated. Thereafter, an unexposed portion of the uncured core formation layer is dissolved away with the use of a developing liquid, whereby a core layer is formed as having the predetermined pattern.

Subsequently, a photosensitive varnish of the photosensitive resin composition as the cladding layer formation material is applied over the core layer. Then, the cladding layer formation material is irradiated with light such as ultraviolet radiation and, as required, heat-treated, whereby an over-cladding layer (upper cladding layer portion) is formed. Thus, the intended optical waveguide is produced through these process steps.

Exemplary materials for the substrate include a silicon wafer, a metal substrate, a polymer film and a glass substrate. Examples of the metal substrate include stainless steel plates such as of JIS SUS. Specific examples of the polymer film include polyethylene terephthalate (PET) films, polyethylene naphthalate films and polyimide films. The substrate typically has a thickness of 10 μm to 3 mm.

Specifically, the light irradiation may be irradiation with ultraviolet radiation. Exemplary ultraviolet light sources for the irradiation with the ultraviolet radiation include a low pressure mercury lamp, a high pressure mercury lamp and an ultrahigh pressure mercury lamp. The dose of the ultraviolet radiation is typically about 10 to about 20000 $mJ/cm^2$, preferably about 100 to about 15000 $mJ/cm^2$, more preferably about 500 to about 10000 $mJ/cm^2$.

After the light exposure by the irradiation with the ultraviolet radiation, the heat treatment may be further performed to complete a photoreaction for the curing. Conditions for the heat treatment are typically a temperature of 80° C. to 250° C. and a period of 10 seconds to 2 hours, preferably a temperature of 100° C. to 150° C. and a period of 5 minutes to 1 hour.

The cladding layer formation material is, for example, a resin composition containing any of various liquid epoxy resins and solid epoxy resins such as bisphenol-A epoxy resins, bisphenol-F epoxy resins, hydrogenated bisphenol-A epoxy resins, fluorinated epoxy resins and epoxy-modified silicone resins, and any of the aforementioned photoacid generators. The formulation of the cladding layer formation material is properly designed so that the cladding layer formation material has a lower refractive index than the core layer formation material. For preparation of the cladding layer formation material to be applied in the form of a varnish, as required, any of conventionally known various organic solvents may be used in a proper amount so as to impart the varnish with a viscosity suitable for the application of the varnish, and various additives (an antioxidant, an adhesiveness imparting agent, a leveling agent and an ultraviolet radiation (UV) absorbing agent) may be used in proper amounts as long as the functions of the optical waveguide produced by using the core layer formation material are not impaired.

Examples of the organic solvent to be used for the preparation of the varnish include ethyl lactate, methyl ethyl ketone, cyclohexanone, 2-butanone, N,N-dimethylacetamide, diglyme, diethylene glycol methyl ethyl ether, propylene glycol methyl acetate, propylene glycol monomethyl ether, tetramethylfurane and dimethoxyethane as in the aforementioned case. These organic solvents may be used alone or in combination in a proper amount so as to impart the varnish with a viscosity suitable for the application of the varnish.

Exemplary methods for the application of the formation materials for the respective layers on the substrate include coating methods employing a spin coater, a coater, a spiral coater, a bar coater or the like, a screen printing method, a capillary injection method in which the material is injected into a gap formed with the use of spacers by the capillary phenomenon, and a continuous roll-to-roll (R-to-R) coating method employing a coating machine such as a multi-coater. The optical waveguide may be provided in the form of a film optical waveguide by removing the substrate.

The optical waveguide thus produced may be used as an optical waveguide, for example, for a hybrid flexible printed wiring board for optical/electrical transmission.

EXAMPLES

Next, the present invention will be described by way of examples thereof. However, it should be understood that the present invention be not limited to these examples. In the examples, the term “part(s)” means “part(s) by weight” unless otherwise specified.

Example 1

Prior to production of an optical waveguide according to the example, photosensitive varnishes were prepared as a cladding layer formation material and a core layer formation material.

<Preparation of Cladding Layer Formation Material>

Under shaded conditions, 50 parts of a liquid bifunctional fluoroalkyl epoxy resin (H022 available from Tosoh F-Tech, Inc.), 50 parts of a liquid bifunctional alicyclic epoxy resin (CELLOXIDE 2021P available from Daicel Corporation), 4.0 parts of a photoacid generator (ADEKAOPTOMER SP-170 available from ADEKA Corporation), 0.54 parts of a phosphorus antioxidant (HCA available from Sanko Co., Ltd.) and 1 part of a silane coupling agent (KBM-403 available from Shin-Etsu Silicones Co., Ltd.) were mixed together for complete dissolution with heating to 80° C. and stirring. Thereafter, the resulting solution was cooled to a room temperature (25° C.), and then filtered by a heat and pressure filtering process with the use of a membrane filter having a pore diameter of 1.0 μm. Thus, the photosensitive varnish as the cladding layer formation material was prepared.

<Preparation of Core Layer Formation Material>

Under shaded conditions, 50 parts of a solid polyfunctional aliphatic epoxy resin (EHPE 3150 available from Daicel Corporation), 50 parts of a solid hydrogenated bisphenol-A epoxy resin (YX-8040 available from Mitsubishi Chemical Corporation), 1.0 part of a photoacid generator (WPI-116 available from Wako Pure Chemical Industries, Ltd., represented by the formula (2) wherein X is $SbF_E$, and provided in the form of a 50 wt % propylene carbonate solution (equivalent to an actual photoacid generator amount of 0.5 parts)), 0.5 parts of a hindered phenol antioxidant (Songnox 1010 available from Kyodo Chemical Co., Ltd.) and 0.5 parts of a phosphorus antioxidant (HCA available from Sanko Co., Ltd.) were mixed with and completely dissolved in 40 parts of ethyl lactate with heating to 85° C. and stirring. Thereafter, the resulting solution was cooled to a room temperature (25° C.), and then filtered by a heat and pressure filtering process with the use of a membrane filter having a pore diameter of 1.0 μm. Thus, the photosensitive varnish as the core layer formation material was prepared.

<<Production of Optical Waveguide>>

<Formation of Under-Cladding Layer>

The photosensitive varnish as the cladding layer formation material was applied onto a silicon wafer having a thickness of about 500 μm by means of a spin coater. Then, the applied varnish was exposed to mixed radiation (broad light) at 5000 mJ (integrated at a wavelength of 365 nm). Thereafter, the resulting varnish was subjected to a post heat treatment at 130° C. for 10 minutes. Thus, an under-cladding layer (having a thickness of 20 μm) was formed.

<Formation of Core Layer>

The photosensitive varnish as the core layer formation material was applied onto the formed under-cladding layer with the use of a spin coater, and then dried (at 130° C. for 5 minutes) on a hot plate for removal of the organic solvent (ethyl lactate). Thus, an uncured layer was formed in an uncured film state. The formed uncured layer was subjected to mask pattern exposure (pattern width/pattern pitch (L/S)=50 μm/200 μm) by irradiation with mixed radiation (broad light) at 9000 mJ (integrated at a wavelength of 365 nm), and to a post heat treatment (at 140° C. for 5 minutes). Thereafter, the resulting layer was developed in N,N-dimethylacetamide (DMAc) (at 25° C. for 3 minutes), and rinsed with water. Then, the resulting layer was dried (at 120° C. for 5 minutes) on a hot plate for removal of water. Thus, a core layer (having a thickness of 55 μm) was formed as having a predetermined pattern.

Thus, the optical waveguide was produced, which had the under-cladding layer formed on the silicon wafer and the core layer formed in the predetermined pattern on the under-cladding layer.

Example 2

An optical waveguide was produced in substantially the same manner as in Example 1, except that WPAG-1056 (available from Wako Pure Chemical Industries, Ltd., represented by the formula (1) wherein X is $SbF_6$, and provided in the form of a 50 wt % propylene carbonate solution) was used as the photoacid generator in a proportion of 1.0 part (equivalent to an actual photoacid generator amount of 0.5 parts) in the preparation of the photosensitive varnish as the core layer formation material.

Example 3

An optical waveguide was produced in substantially the same manner as in Example 1, except that CPI-101A (available from San-Apro, Ltd., represented by the formula (1) wherein X is $SbF_6$, and provided in the form of a 50 wt % propylene carbonate solution) was used as the photoacid generator in a proportion of 1.0 part (equivalent to an actual photoacid generator amount of 0.5 parts) in the preparation of the photosensitive varnish as the core layer formation material.

Example 4

An optical waveguide was produced in substantially the same manner as in Example 1, except that the proportion of the photoacid generator (WPI-116 available from Wako Pure Chemical Industries, Ltd., represented by the formula (2) wherein X is $SbF_6$, and provided in the form of a 50 wt % propylene carbonate solution) was changed to 3.0 parts (equivalent to an actual photoacid generator amount of 1.5 parts) in the preparation of the photosensitive varnish as the core layer formation material.

Example 5

An optical waveguide was produced in substantially the same manner as in Example 1, except that the proportion of the photoacid generator (WPI-116 available from Wako Pure Chemical Industries, Ltd., represented by the formula (2) wherein X is $SbF_6$, and provided in the form of a 50 wt % propylene carbonate solution) was 0.5 parts (equivalent to an actual photoacid generator amount of 0.25 parts) and the exposure dose of the mixed radiation was changed to 18000 mJ in the preparation of the photosensitive varnish as the core layer formation material.

Example 6

An optical waveguide was produced in substantially the same manner as in Example 1, except that WPI-116 (available from Wako Pure Chemical Industries, Ltd., represented by the formula (2) wherein X is $SbF_6$, and provided in the form of a 50 wt % propylene carbonate solution) and WPAG-1056 (available from Wako Pure Chemical Industries, Ltd., represented by the formula (1) wherein X is $SbF_6$, and provided in the form of a 50 wt % propylene carbonate solution) were used as the photoacid generator in proportions of 0.5 parts (equivalent to an actual photoacid generator amount of 0.25 parts) and 0.5 parts (equivalent to an actual photoacid generator amount of 0.25 parts), respectively, in the preparation of the photosensitive varnish as the core layer formation material.

Comparative Example 1

An optical waveguide was produced in substantially the same manner as in Example 1, except that ADECAOPTOMER SP-170 (available from ADEKA Corporation, and provided in the form of a 50 wt % propylene carbonate solution) was used as the photoacid generator in a proportion of 1.0 part (equivalent to an actual photoacid generator amount of 0.5 parts) in the preparation of the photosensitive varnish as the core layer formation material.

Comparative Example 2

An optical waveguide was produced in substantially the same manner as in Example 1, except that a 50 wt % propylene carbonate solution of WPAG-1057 (available from Wako Pure Chemical Industries, Ltd.) was used as the photoacid generator in a proportion of 1.0 part (equivalent to an actual photoacid generator amount of 0.5 parts) in the preparation of the photosensitive varnish as the core layer formation material.

Measurement and evaluation were performed on the photosensitive varnishes thus prepared as the core layer formation materials and the optical waveguides in the following manner for patternability evaluation (evaluation of the core layer formation materials), and optical waveguide loss (linear loss) evaluation and reflow resistance evaluation (evaluations of the optical waveguides). Together with the formulations of the core layer formation materials, the results are shown below in Table 1. An absorption limit (O—O transition energy) (eV) of each of the photoacid generators used as the ingredients of the core layer formation materials was calculated based on the shape of an ultraviolet spectrum obtained by spectrometrically analyzing a 0.1 wt % propylene carbonate solution of the photoacid generator by means of an ultraviolet/visible spectrophotometer, and shown in a footnote of Table 1.

[Patternability Evaluation]

The core layer pattern formed on the under-cladding layer from each of the photosensitive varnishes prepared as the core layer formation materials in Examples and Comparative Examples was observed by means of an optical microscope, and the observation result was evaluated based on the following criteria:

Acceptable (○): The core layer pattern had a rectangular shape without pattern undulation and bottom broadening.

Unacceptable (x): The core layer pattern did not have a rectangular shape, but had an abnormal shape such as pattern undulation, distortion and bottom broadening.

[Optical Waveguide Loss (Linear Loss) Evaluation]

The photosensitive varnish as the cladding layer formation material was applied over each of the optical waveguide core layer patterns formed in Examples and Comparative Examples by means of a spin coater, and then prebaked on a hot plate (at 100° C. for 5 minutes). Thereafter, the resulting photosensitive varnish coating film was exposed to mixed radiation (broad light) at 5000 mJ (integrated at a wavelength of 365 nm), and then subjected to a post heat treatment (at 120° C. for 5 minutes), whereby an over-cladding layer was formed. Thus, an optical waveguide (having an over-cladding layer thickness of 15 μm as measured on the core layer pattern and an optical waveguide total thickness of 90 Mm) was produced.

The optical waveguide was used as a sample. Light emitted from a light source (850 nm VCSEL light source OP250 available from Miki Inc.) was collected and inputted into the sample by means of a multi-mode fiber (FFP-G120-0500 available from Miki Inc., and having a MMF diameter of 50 μm and an NA of 0.2). Then, light outputted from the sample was collected by a lens (FH14-11 available from Seiwa Optical Co., Ltd., and having a magnification of 20× and an NA of 0.4), and detected at four channels by a light measurement system (optical multi-power meter Q8221 available from Advantest Corporation) for evaluation by a cut-back method. A linear loss was calculated from an average total loss for the four channels, and the sample was evaluated based on the following criteria:

Acceptable (○): The total linear loss was not greater than 0.04 dB/cm.

Unacceptable (x): The total linear loss was greater than 0.04 dB/cm.

[Reflow Resistance Evaluation]

The optical waveguide was used as a sample. The sample was exposed to a heating process at a peak temperature of 250° C. to 255° C. for 45 seconds in an air atmosphere by means of a reflow simulator (SMT Scope SK-5000 available from SANYOSEIKO Co., Ltd.) The optical waveguide loss (linear loss) evaluation was performed in the aforementioned manner, and the sample was evaluated for reflow resistance based on the following criteria:

Acceptable (○): A loss rise (increase) after the reflow heating process was not greater than 0.01 dB/cm.

Unacceptable (x): A loss rise (increase) after the reflow heating process was greater than 0.01 dB/cm.

TABLE 1

| | Example | | | | | | Comparative Example | |
|---|---|---|---|---|---|---|---|---|
| | 1 | 2 | 3 | 4 | 5 | 6 | 1 | 2 |
| Resin component (aliphatic epoxy resin) | | | | | | | | |
| EHPE3150 | 50 | 50 | 50 | 50 | 50 | 50 | 50 | 50 |
| YX-8040 | 50 | 50 | 50 | 50 | 50 | 50 | 50 | 50 |
| Photoacid generator* | | | | | | | | |
| WPI-116 | 1.0 | — | — | 3.0 | 0.5 | 0.5 | — | — |
| WPAG-1056 | — | 1.0 | — | — | — | 0.5 | — | — |
| CPI-101A | — | — | 1.0 | — | — | — | — | — |
| SP-170 | — | — | — | — | — | — | 1.0 | — |
| WPAG-1057 | — | — | — | — | — | — | — | 1.0 |
| Antioxidant | | | | | | | | |
| Songnox 1010 | 0.5 | 0.5 | 0.5 | 0.5 | 0.5 | 0.5 | 0.5 | 0.5 |
| HCA | 0.5 | 0.5 | 0.5 | 0.5 | 0.5 | 0.5 | 0.5 | 0.5 |
| Organic solvent | | | | | | | | |
| Ethyl lactate | 40 | 40 | 40 | 40 | 40 | 40 | 40 | 40 |
| Patternability | ○ | ○ | ○ | ○ | ○ | ○ | ○ | × |
| Optical waveguide loss evaluation | ○ | ○ | ○ | ○ | ○ | ○ | × | — |
| Reflow resistance | ○ | ○ | ○ | ○ | ○ | ○ | ○ | — |

*Used in the form of a 50 wt % propylene carbonate solution.

The absorption limits (O-O transition energies) of the photoacid generators each calculated based on the shape of the ultraviolet spectrum obtained by spectrometrically analyzing the 0.1 wt % propylene carbonate solution of the photoacid generator by means of the ultraviolet/visible spectrophotometer are shown below.

WPI-116: 4.05 eV

WPAG-1056: 3.64 eV

CPI-101A: 3.53 eV

SP-170: 3.49 eV

WPAG-1057: 4.26 eV

The above results indicate that the inventive photosensitive resin compositions (Examples) respectively prepared by using the photoacid generators each having the characteristic property (x) (the absorption limit (O—O transition energy) calculated based on the shape of the ultraviolet spectrum obtained by spectrometrically analyzing the 0.1 wt % propylene carbonate solution of the photoacid generator by means of the ultraviolet/visible spectrophotometer is 3.5 to 4.1 eV) and the optical waveguides respectively having the core layers formed from these photosensitive resin compositions were satisfactory in patternability evaluation, optical waveguide loss (linear loss) evaluation and reflow resistance evaluation.

Out of the photosensitive resin compositions respectively prepared by using the photoacid generators not satisfying the characteristic property (x) (the absorption limit (O—O transition energy) calculated based on the shape of the ultraviolet spectrum obtained by spectrometrically analyzing the 0.1 wt % propylene carbonate solution of the photoacid generator by means of the ultraviolet/visible spectrophotometer is 3.5 to 4.1 eV) and the optical waveguides respectively having the core layers formed from these photosensitive resin compositions, in contrast, the photosensitive resin composition and the optical waveguide of Comparative Example 1 which employed the photoacid generator having an absorption limit of 3.49 eV outside the aforementioned range were excellent in patternability evaluation and reflow resistance evaluation, but poorer in optical waveguide loss (linear loss) evaluation. The photosensitive resin composition of Comparative Example 2 which employed the photoacid generator having an absorption limit of 4.26 eV outside the aforementioned range suffered from pattern distortion and other pattern shape abnormality in the patternability evaluation, making it impossible to perform the optical waveguide loss (linear loss) evaluation and the reflow resistance evaluation.

While specific forms of the embodiments of the present invention have been shown in the aforementioned inventive examples, the inventive examples are merely illustrative of the invention but not limitative of the invention. It is contemplated that various modifications apparent to those skilled in the art could be made within the scope of the invention.

The inventive photosensitive resin composition for the optical waveguide is useful as a material for formation of a component of the optical waveguide, particularly, as a core layer formation material. The optical waveguide produced by employing the optical waveguide photosensitive resin composition is used, for example, for a hybrid flexible printed wiring board for optical/electrical transmission.

What is claimed is:

1. A photosensitive resin composition for an optical waveguide, the photosensitive resin composition comprising:

a resin component; and a photoacid generator;

wherein the photoacid generator has an absorption limit, which is O—O transition energy, calculated based on the shape of an ultraviolet spectrum obtained by spectrometrically analyzing a 0.1 wt % propylene carbonate solution of the photoacid generator with an ultraviolet/visible spectrophotometer being in a range of 3.5 to 4.1 eV.

2. The photosensitive resin composition according to claim 1, wherein the photoacid generator comprises at least one photoacid generator selected from the group consisting of general formula (1) and general formula (2):

$$R_1-S^{+}(R_2)-R_3 \quad X^{-} \qquad (1)$$

wherein at least two of $R_1$ to $R_3$ are aryl groups, and X is an anion comprising antimony, phosphorus or boron;

$$R_4-I^{+}-R_5 \quad X^{-} \qquad (2)$$

wherein $R_4$ and $R_5$, which may be the same or different, are each an aryl group, an alkyl group or a cycloalkyl group, and X is an anion comprising antimony, phosphorus or boron.

3. The photosensitive resin composition according to claim 2, wherein X is an antimony hexafluoride anion which is $SbF_6$.

4. The photosensitive resin composition according to claim 1, wherein the photoacid generator is present in a proportion of 0.1 to 3 parts by weight based on 100 parts by weight of the resin component.

5. The photosensitive resin composition according to claim 1, wherein the resin composition is configured to be formed into a core layer provided in a predetermined pattern in a cladding layer for transmission of an optical signal.

6. A photocurable film for formation of an optical waveguide core layer, wherein the photocurable film is produced by forming the photosensitive resin composition according to claim 1 into a film shape.

7. An optical waveguide comprising:

a substrate;

a cladding layer provided on the substrate; and a core layer provided in a predetermined pattern in the cladding layer for transmission of an optical signal;

wherein the core layer is a core layer formed by curing the photosensitive resin composition according to claim 1.

8. A hybrid flexible printed wiring board for optical/electrical transmission, wherein the hybrid flexible printed wiring board for optical/electrical transmission comprises the optical waveguide according to claim 7.

9. An optical waveguide comprising:

a substrate;

a cladding layer provided on the substrate; and a core layer provided in a predetermined pattern in the cladding layer for transmission of an optical signal;

wherein the core layer is a core layer formed by curing the photocurable film according to claim 6.

10. A hybrid flexible printed wiring board for optical/electrical transmission, wherein the hybrid flexible printed wiring board for optical/electrical transmission comprises the optical waveguide according to claim 9.

* * * * *